United States Patent
Suuronen et al.

(10) Patent No.: US 9,417,280 B2
(45) Date of Patent: Aug. 16, 2016

(54) SYSTEM AND METHOD FOR ANALYZING VOLTAGE BREAKDOWN IN ELECTROSTATIC CHUCKS

(71) Applicant: Varian Semiconductor Equipment Associates, Inc., Gloucester, MA (US)

(72) Inventors: David E. Suuronen, Newburyport, MA (US); Scott E. Peitzsch, Tewksbury, MA (US)

(73) Assignee: Varian Semiconductor Associates, Inc., Gloucester, MA (US)

( * ) Notice: Subject to any disclaimer, the term of this patent is extended or adjusted under 35 U.S.C. 154(b) by 663 days.

(21) Appl. No.: 13/872,440

(22) Filed: Apr. 29, 2013

(65) Prior Publication Data

US 2014/0324372 A1    Oct. 30, 2014

(51) Int. Cl.
*G01R 13/00* (2006.01)
*G01R 31/12* (2006.01)

(52) U.S. Cl.
CPC .................................. *G01R 31/1227* (2013.01)

(58) Field of Classification Search
CPC ................. G06F 2217/76; G05B 2219/32371; G05B 23/0254; G01R 31/12
See application file for complete search history.

(56) References Cited

U.S. PATENT DOCUMENTS

| | | | |
|---|---|---|---|
| 5,210,704 A * | 5/1993 | Husseiny | G01H 1/003 702/34 |
| 5,329,591 A | 7/1994 | Magrill | |
| 5,477,150 A | 12/1995 | Ham, Jr. et al. | |
| 6,332,961 B1 | 12/2001 | Johnson et al. | |
| 7,474,989 B1 * | 1/2009 | Wilcoxon | G05B 23/0254 700/21 |
| 7,733,095 B2 | 6/2010 | Pipitone et al. | |
| 7,750,644 B2 | 7/2010 | Pipitone et al. | |
| 7,750,645 B2 | 7/2010 | Pipitone et al. | |
| 7,768,269 B2 | 8/2010 | Pipitone et al. | |
| 8,050,898 B2 * | 11/2011 | Hansen | G03F 7/705 703/6 |
| 2004/0031699 A1 | 2/2004 | Shoji | |
| 2006/0226786 A1 * | 10/2006 | Lin | H01J 37/3299 315/111.21 |
| 2008/0192405 A1 | 8/2008 | Purohit | |
| 2009/0044750 A1 | 2/2009 | Pipitone | |

OTHER PUBLICATIONS

Le Vine, David M., Review of Measurements of the RF Spectrum of Radiation from Lightning, NASA Technical Memorandum 87788, Mar. 1986 pp. 1-15 with appendix, NASA.

* cited by examiner

*Primary Examiner* — Elias Desta (57) ABSTRACT

A system, instructions and a method of determining when an impending failure is likely to occur absent corrective action are disclosed. The system samples the output of a power supply which powers an electrostatic chuck, and determines when that output is outside acceptable limits. The output is sampled at a sufficiently high frequency so as to detect transient anomalies, which are not detectable at lower sampling rates. In some embodiments, the output is converted to a frequency spectrum. The empirical model is compared to known good reference models and, in some embodiments, failure reference models of known failure modes to determine whether an impending failure will occur, and which type of failure.

18 Claims, 7 Drawing Sheets

SYSTEM AND METHOD FOR ANALYZING VOLTAGE BREAKDOWN IN ELECTROSTATIC CHUCKS

Embodiments of the present invention relate to systems and methods for predictively analyzing voltage breakdown for electrostatic chucks used in workpiece processing.

BACKGROUND OF THE INVENTION

Ion implanters are commonly used in the production of semiconductor workpieces. An ion source is used to create an ion beam, which is then directed toward the workpiece. As the ions strike the workpiece, they dope a particular region of the workpiece. The configuration of doped regions defines their functionality, and through the use of conductive interconnects, these workpieces can be transformed into complex circuits.

As a workpiece is being implanted, it is typically clamped to a chuck. This clamping may be mechanical or electrostatic in nature. This chuck traditionally consists of a plurality of layers. The top layer, also referred to as the dielectric layer, contacts the workpiece, and is made of an electrically insulating or semiconducting material, such as alumina with embedded metal electrodes, since it produces the electrostatic field without creating a short circuit. Methods of creating this electrostatic field are known to those skilled in the art and will not be described herein.

A second layer, also referred to as the base, may be made from an insulating material. To create the required electrostatic force, a plurality of electrodes may be disposed between the dielectric layer and the insulating layer. In another embodiment, the plurality of electrodes may be embedded in the insulating layer. The plurality of electrodes is constructed from an electrically conductive material, such as metal.

Figure 1:
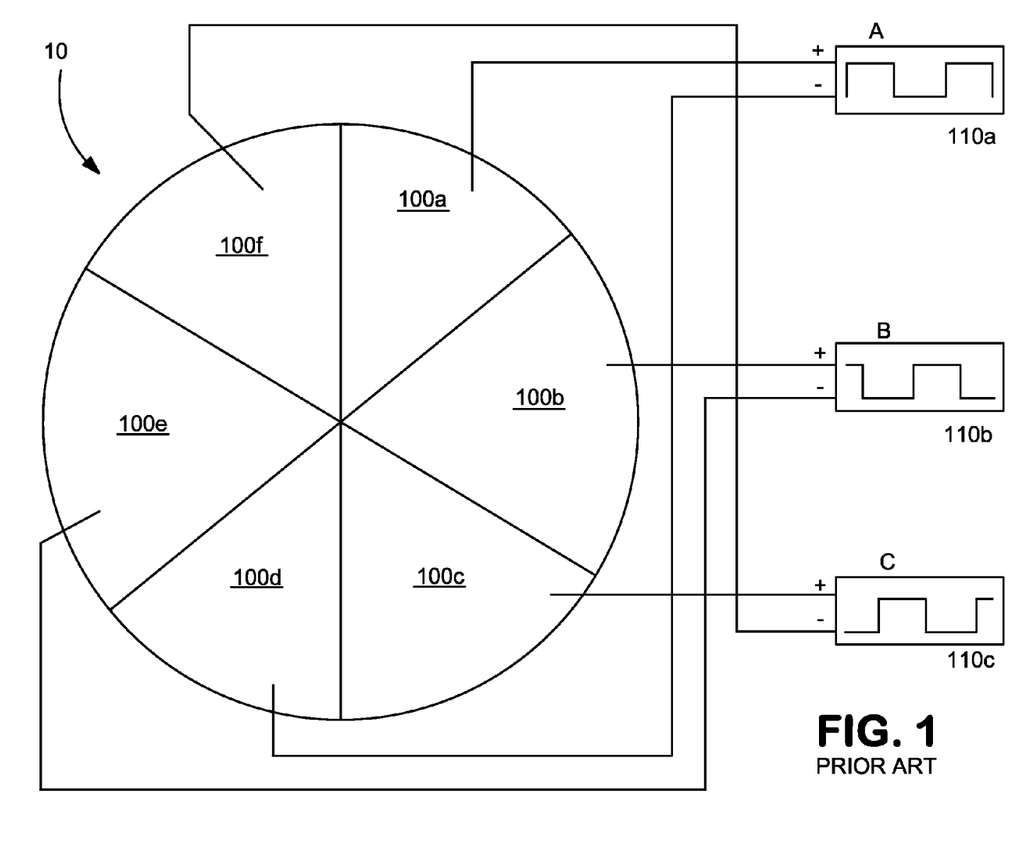
FIG. 1 represents an electrostatic chuck of the prior art.

FIG. 1 shows a top view of a chuck 10, specifically showing the plurality of electrodes 100a-f of the chuck 10. As shown, each of the electrodes 100a-f is electrically isolated from the others. These electrodes 100a-f may be configured such that opposite electrodes have opposite voltages. For example, electrode 100a may have a positive voltage while electrode 100d may have a negative voltage. These voltages may be DC, or may vary with time to maintain the electrostatic force. For example, as shown in FIG. 1, the voltage applied to each electrode 100a-f may be a bipolar square wave. In the embodiment shown in FIG. 1, three pairs of electrodes are employed. Each pair of electrodes is in electrical communication with a respective power source 110a-c, such that one electrode receives the positive output and the other electrode receives the negative output. Each power source 110a-c generates the same square wave output, in terms of period and amplitude. However, each square wave is phase shifted from those adjacent to it. Thus, as shown in FIG. 1, electrode 100a is powered by square wave A, while electrode 100b is powered by square wave B, which has a phase shift of 120° relative to square wave A. Similarly, square wave C is phase shifted 120° from square wave B. These square waves are shown graphically on the power supplies 110a-c of FIG. 1. Of course, other numbers of electrodes and alternate geometries may be used.

The voltages applied to the electrodes 100a-f serve to create an electrostatic force, which clamps the workpiece to the chuck.

It is difficult to detect arcing or high voltage breakdown conditions occurring at or near the electrostatic chucks. These deleterious conditions may occur with an electrostatic chuck being used with any workpiece processing system, including ion beam line systems and plasma deposition systems. Furthermore, failure sites are typically sufficiently small that they are not easily visible to an operator until the occurrence of a catastrophic failure, during which the chuck, workpieces, or both are damaged.

Consequently, corrective action cannot be taken until the damage has already occurred. This results in lost productivity due to the down time for the processing system, damaged or unusable processed workpieces and a monetary impact resulting from the need to replace the damaged chuck. This results in an increase in the cost of ownership (COO) to the user of an ion implanter or similar systems. Therefore, it would be beneficial if there were a system and method of detecting conditions representative of a future failure absent corrective action sufficiently early so as to avoid damage to the chuck, as well as minimizing lost productivity.

SUMMARY OF THE INVENTION

A system, instructions and a method of determining when an impending failure is likely to occur absent corrective action are disclosed. The system samples the output of a power supply which powers an electrostatic chuck, and determines when that output is outside acceptable limits. The output is sampled at a sufficiently high frequency so as to detect transient anomalies, which are not detectable at lower sampling rates. In some embodiments, the output is converted to a frequency spectrum. The empirical model is compared to known good reference models and, in some embodiments, failure reference models of known failure modes to determine whether an impending failure is likely to occur, and which type of failure.

In one embodiment, a method of monitoring a condition of an electrostatic chuck (ESC) is disclosed. The method comprises monitoring an output waveform provided to the ESC from a power supply; converting the output waveform to a series of digital values; creating an empirical model from the digital values; comparing the empirical model to a reference model; determining, based on the comparison, that an impending potential failure is likely to occur absent corrective action; and displaying a result of the determining operation on a status mechanism. In a further embodiment, the method also comprises comparing the empirical model to a failure reference model of a known failure mode if it is determined that an impending failure is likely to occur absent corrective action, so as to identify cause of the impending failure; and displaying the cause on the status mechanism.

In another embodiment, a non-transitory computer readable medium is disclosed. The medium comprises instructions, which when executed by a processing unit, monitor an output waveform provided to an electrostatic chuck (ESC) from a power supply; convert the monitored output waveform to a series of digital values; create an empirical model from the digital values; compare the empirical model to a reference model; determine, based on the comparison, that an impending failure is likely to occur absent corrective action; and display a result of the determining step on a status mechanism.

In another embodiment, a system of identifying impending failures in an ion implantation system is disclosed. The system comprises an electrostatic chuck (ESC); an ESC power supply in communication with the ESC, the ESC power supply comprising an analog to digital converter; an ESC processing unit; and a storage element in communication with the ESC processing unit, comprising instructions, which when executed by the ESC processing unit, cause the ESC power supply to monitor an output current provided to the ESC by the ESC power supply; convert the monitored output current to a series of digital values; and create an empirical model based on the digital values; and a system controller, in communication with the ESC power supply, comprising a status mechanism; a processing unit; and a storage element in communication with the processing unit, comprising instructions, which when executed by the processing unit, cause the system controller to receive the empirical model from the ESC power supply; compare the empirical model to a reference model; and provide an indication on the status mechanism if results of the comparison indicate an impending failure is likely to occur absent corrective action.

BRIEF DESCRIPTION OF FIGURES

For a better understanding of the present disclosure, reference is made to the accompanying drawings, which are incorporated herein by reference and in which.

DETAILED DESCRIPTION OF THE INVENTION

Figure 2:
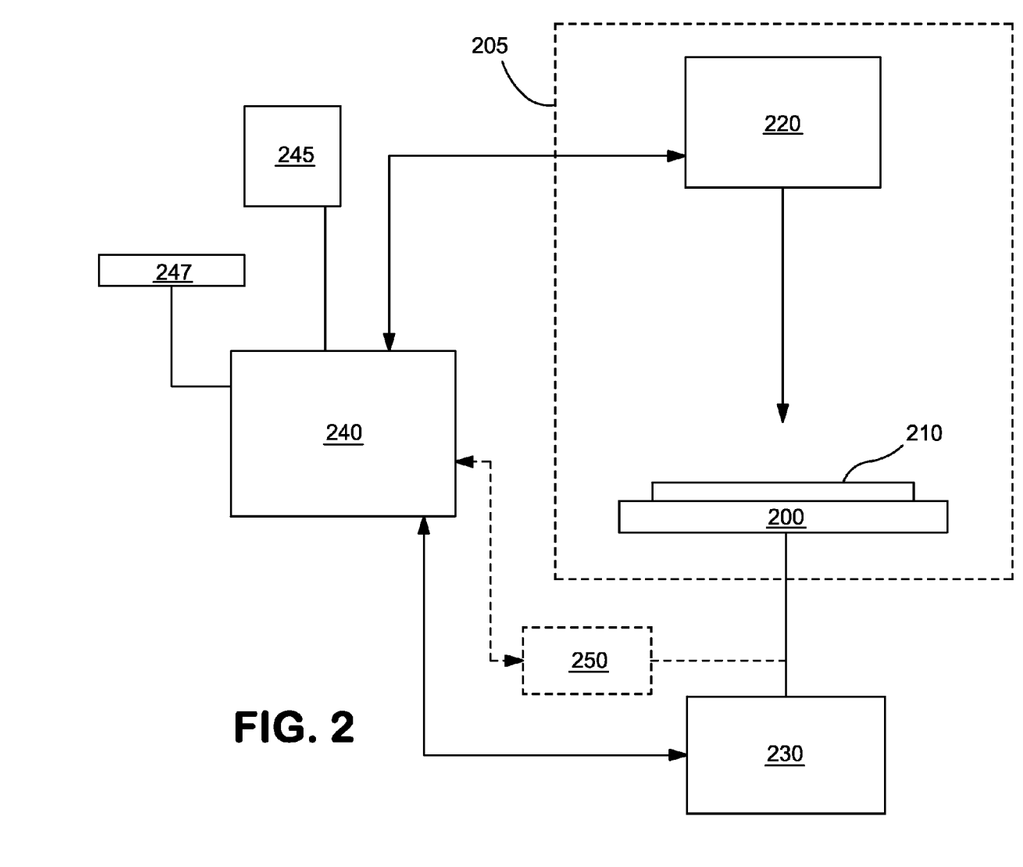
FIG. 2 represents a system using an electrostatic chuck according to one embodiment.

As described above, electrostatic chucks (ESCs) are used to retain workpieces during processing steps, such as ion implantation. FIG. 2 shows a representative configuration of an ion implanting system using an ESC. This ion implanting system 205 includes an ion generating source 220, which may include an energy source to ionize a dopant gas, and an extraction means to direct the ions 225 toward the workpiece 210. The workpiece 210 is secured in position by an electrostatic chuck 200.

The voltages for the electrostatic chuck 200 are generated by the ESC power supply 230, which supplies the requisite voltages and currents to the electrodes in the ESC 200. The connection between the ESC power supply 230 and the ESC 200 may be accomplished in numerous ways. In one embodiment, a connector is used to make the electrical contacts. For example, a female connector may be disposed on the underside of the ESC 200, while the wiring harness 235 from the ESC power supply 230 may terminate in a male connector. In another embodiment, the ESC 200 may include a plurality of conductive contacts on its underside. The wiring harness 235 for the ESC power supply 230 may terminate in a plurality of spring loaded "pogo pins", each of which, when extended, contacts a respective one of these conductive contacts. Other mechanisms to electrically connect the ESC 200 to the ESC power supply 230 are also possible. In certain embodiments, the ESC power supply 230 also includes an internal ESC processing unit in communication with a storage element. This storage element contains instructions, which when executed by the ESC processing unit, allow the ESC power supply 230 to perform specific functions described below. The storage element may be any non-transitory computer readable medium, such as semiconductor memory, optical memory, or magnetic memory.

A system controller 240 is in communication with the ESC power supply 230, as well as other components. Communication with the ESC power supply 230 may be initiated by the system controller 240 to control the actions of the ESC power supply 230, such as turn on time and turn off time. In certain embodiments, the communication may also be used to extract data from the ESC power supply 230, as described in more detail below.

The system controller 240 may control the operating parameters of the ion generating source 220. This communication with other components may be via a network connection, a direct wired connection or a wireless connection. The system controller 240 has one or more communication circuits, which allow it to communicate with other components, such as ESC power supply 230. For example, the system controller 240 may have a dedicated communication circuit for each component that it interfaces with. In another embodiment, these components may utilize a sharable communication mechanism, which as Ethernet, which allows multiple devices to share a common communication circuit. In other embodiments, the sensors in the system, which may be electrical or mechanical, may communicate with the system controller 240 via hardwire or fiber optic cables. Alternatively, wireless communication may also be used.

Additionally, the system controller 240 may have a status mechanism 245 to show system status to an operator. In some embodiments, this status mechanism 245 may be a video display unit, such as a LCD monitor or the like. Using this status mechanism 245, the operator may be informed of current operating conditions in the ion implanting system 205. Furthermore, the system controller 240 may also include an input device 247, which allows the operator to enter commands, parameter changes or other information into the system. The input device 247 may be, for example, a keyboard or a touchscreen device.

The system controller 240 includes a processing unit in communication with a storage element. The storage element may be any non-transitory computer readable medium, such a semiconductor memory device, such as RAM, ROM, FLASH ROM, etc. In other embodiments, the storage element may include magnetic or optical storage, such as a disk drive or CDROM, respectively. The storage element contains instructions, which when executed by the system controller processing unit, allow the system controller 240 to perform the functions described herein. These instructions may be written in any suitable programming language, which is not limited by this disclosure. In addition, the storage element may include data, such as reference waveforms and frequency spectrums, as described below.

In a first embodiment, described above, the ESC power supply 230 includes an ESC processing unit and a storage element, which contains instructions to perform specific functions. In this embodiment, the ESC power supply 230 monitors the clamp current waveform to the ESC 200, such as through the use of a sense resistor and one or more analog-to-digital converters (ADC). Using instructions contained in the storage element, the ESC processing unit creates a frequency spectral analysis of the clamp current waveform. The creation of a frequency spectrum from a time-varying output is well known and will not be described here. In one embodiment, Fourier transforms or fast Fourier transforms (FFTs) are performed. As shown in FIG. 1, the output current may be bipolar square waves. These square waves have a fundamental frequency of $f_o$, where $f_o$ may be between 1 and 300 Hz, or in another embodiment, between 20 and 50 Hz, such as 30 Hz. It is well known that the frequency content of such a square wave is a combination of the odd harmonics of the fundamental frequency, such as $3f_o$, $5f_o$, $7f_o$, etc. To create the requisite frequency spectrum, the ESC processing unit may sample the output waveform at a frequency of, for example, at least 10 times the fundamental frequency ($f_o$). In other embodiments, a sampling frequency of at least 20 times the fundamental frequency is used. In still other embodiments, a sampling frequency of at least 30 times the fundamental frequency is employed. In other embodiments, a sampling frequency of 1000 Hz or higher, as required, may be used. The ESC processing unit then stores the resulting frequency spectrum information in its storage element. This information can be stored in any convenient way, such as using a table or graph, using frequency as the independent variable and amplitude at that frequency as the dependent variable. Of course, other mechanisms for storing this frequency spectrum are also within the scope of the disclosure.

In another embodiment, the ESC processing unit monitors the output current at a sampling rate sufficiently high so as to detect any arcing conditions. The ESC processing unit stores this information as time domain data, where time is the independent variable and the amplitude of the output current is the dependent variable. Since the output current is a cyclical function, the ESC processing unit may create a table or graph with times ranging from 0 to T, where T is the period of the waveform (i.e. the reciprocal of the fundamental frequency, $f_o$). In other words, the graph or table may extend for exactly one period. In other embodiments, the graph or table may extend for multiple periods.

During the first period of the output voltage, the ESC processing unit samples the output current at a sampling rate, such as $M*f_o$, where M has a value of 10 or greater. In other embodiments, M has a value of 20 or greater. In still other embodiments, M has a value of 30 or greater. As described earlier, in some embodiments, a frequency of 1000 Hz or higher is employed. The amplitude of the output current is stored in the position in the graph or table corresponding to the time that the output current was sampled, thereby creating a graph or table having M entries, where M is determined by dividing the sampling rate, such as 1000 Hz, by the fundamental frequency of the waveform, $f_o$. Since the sampling rate may be preferably a multiple of the fundamental frequency, each entry in the graph or table may correspond to a particular point along the waveform, and will continue to correspond to that point for each subsequent cycle of the output current. In one embodiment, the ESC processing unit creates an array, where each subsequent amplitude corresponding to a particular point in the waveform is saved. In other words, the resulting graph includes all of the values of current that were observed during each particular point in the waveform. In another embodiment, the ESC processing unit saves only extreme values sampled at each point in time. For example, only the minimum values, maximum values, or both, that were sampled during that particular point in the waveform are saved. In yet another embodiment, a running average is stored for each point in the waveform. Of course, additional or different values may be saved.

While the above description discusses the use of output current and current waveforms, other embodiments are possible. For example, each of the techniques and procedures described above may also be performed using the voltage waveforms, rather than the current waveforms. Thus, the disclosure is not limited to the use of current in determining an impending failure. Other electrical characteristics, such as voltage or output resistance, may also be used.

In some embodiments, the ESC power supply 230 includes the processing unit and instructions necessary to perform the functions described above, other embodiments are also possible. FIG. 2 also shows an optional monitoring device 250, which is in communication with the output of the ESC power supply 230. For example, to measure current, the monitoring device 250 may include a sense resistor inserted in series, whereby the monitoring device 250 can measure the current by sensing the voltage across the sense resistor. Other methods of monitoring current may also be possible. This monitoring device 250 includes a monitoring device (MD) processing unit in communication with a storage element. The storage element includes the instructions required to execute the functions described above in conjunction with the ESC processing unit. In addition, the storage element allows the storage of the data, such as the tables or graphs generated by performing the functions described above. This monitoring device 250 is also in communication with the system controller 240, so as to share information with it. In this embodiment, the ESC power supply 230 may not have the functionality described above. For example, the ESC power supply 230 may have the ability to provide the needed voltage and current waveforms, but may not have the capability to monitor, analyze and store those waveforms.

Furthermore, although in this embodiment, the monitoring device 250 is shown as a stand alone component, other embodiments are possible. As described above, this monitoring function may be performed by the ESC power supply 230 itself. In another embodiment, this functionality may exist within the system controller 240. For example, the power supply 230 may simply provide the voltage and current required by the chuck 200 without any means of monitoring or analyzing those outputs. The analysis of these outputs may then be performed completely with the system controller 240.

Using any of these embodiments, an empirical model of the output waveform from the ESC power supply 230 can be created. This empirical model may be in the frequency domain or in the time domain, and may be represented in a storage element in a variety of different ways.

This empirical model may then be compared to a reference model to determine whether any unacceptable deviations have occurred. This reference model can be created in a number of ways. For example, the reference model may be created using the techniques described above, using a known good configuration. For example, a known good ESC may be installed in the system of FIG. 2. The ESC 200 is then powered by the ESC power supply 230, as would be done during normal operation. The output waveforms, such as current, voltage or both, can be captured and analyzed. In one embodiment, the current waveform is analyzed using FFT, and the resulting graph, which represents the frequency domain, is saved as a reference model. In other embodiments, the waveforms are analyzed and saved in the time domain.

In another embodiment, this reference model may be generated theoretically, based on the desired output current waveform from the ESC power supply 230. Other methods may be used to create the reference model.

In one embodiment, the reference model is stored in the storage element in the system controller 240. In this embodiment, a commercially available power supply, having FFT capability, may be used as the ESC power supply 230. In other embodiments, the reference models are stored in the storage elements disposed in the monitoring device 250 or the ESC power supply 230. The specific location where the reference models are stored is not limited by this disclosure.

In one embodiment, the comparison of the empirical model and the reference model is performed by the processing unit in the system controller 240. However, this comparison may be performed in any of the components described above. Thus, while reference is made to this embodiment, it is understood that other embodiments are also possible. In this case, the empirical model saved in the storage element of the ESC power supply 230 or the monitoring device 250 is transferred to system control 240, using the communication circuit described above.

The processing unit of the system control 240 then compares the reference model and the empirical model to find discrepancies. These discrepancies may be indicative of a future failure, or a degradation in performance. Thus, the term "impending failure" is used to denote a condition where the characteristic of interest differs from the reference model in such a way so as to indicate that a failure will be likely to occur in the future absent corrective action. As described above, this characteristic may be the frequency spectrum of output current, time domain representation of the output current, the frequency spectrum of the output voltage, the time domain representation of the output voltage, or another electrical characteristic such as output resistance. This failure, if allowed to occur, may damage the electrostatic chuck, the workpiece disposed on the ESC, or both.

The duration of elapsed time between the detection of this discrepancy and the actual failure is not limited by this disclosure. In other words, a particular discrepancy may result in an eventual failure, which may not be imminent. In other cases, the particular discrepancy may be indicative of a failure that is about to occur.

In the case where the models comprise frequency spectrums, the processing unit may compare the frequencies and amplitudes of those frequencies to the reference model. For example, amplitudes at frequencies that are not odd harmonics of the fundamental frequency, $f_o$, can be analyzed to provide an early detection of an impending failure or may be indicative of a failure that has already occurred. Conversely, the lack of an amplitude at an odd harmonic can be an early detection of an impending failure or may be indicative of a failure that has already occurred. Finally, an unexpected amplitude at an odd harmonic, such as an amplitude which is greater than expected, can be interpreted as an early detection of an impending failure or indicative of a failure that has already occurred. Of course, this illustrates several ways in which the reference model may be compared to the empirical model. Other ways may also be used and are within the scope of the disclosure.

In the case where the models comprise time domains, the processing unit may compare the amplitude of the output current at each time interval to the reference model. Amplitudes that are greater than, or less than a predetermined difference from the reference model, can be an early detection of an impending failure or may be indicative of a failure that has already occurred.

In some embodiments, as described above, the current (and voltage) waveforms may be bipolar square waves. As such, the waveforms should be between a first current value, I and the negative value of that first current, or −I. Similarly, the voltage waveform should be between V and −V. Thus, an envelope of acceptable values may be between I and −I (or V and −V), where deviations outside that envelope are determined to discrepancies. In some embodiments, the acceptable envelope may be greater than I and −I. For example, a margin of, for example, 10%, may be included, such that currents greater than 1.1I or less than −1.1I may be viewed as discrepancies. In other embodiments, values within the envelope may also be monitored for discrepancies. Any of these discrepancies may be indicative of an impending failure or of a failure that has already occurred.

The detection of an unacceptable deviation may then be reported to the operator, such as through the use of the status mechanism 245.

Figure 3:
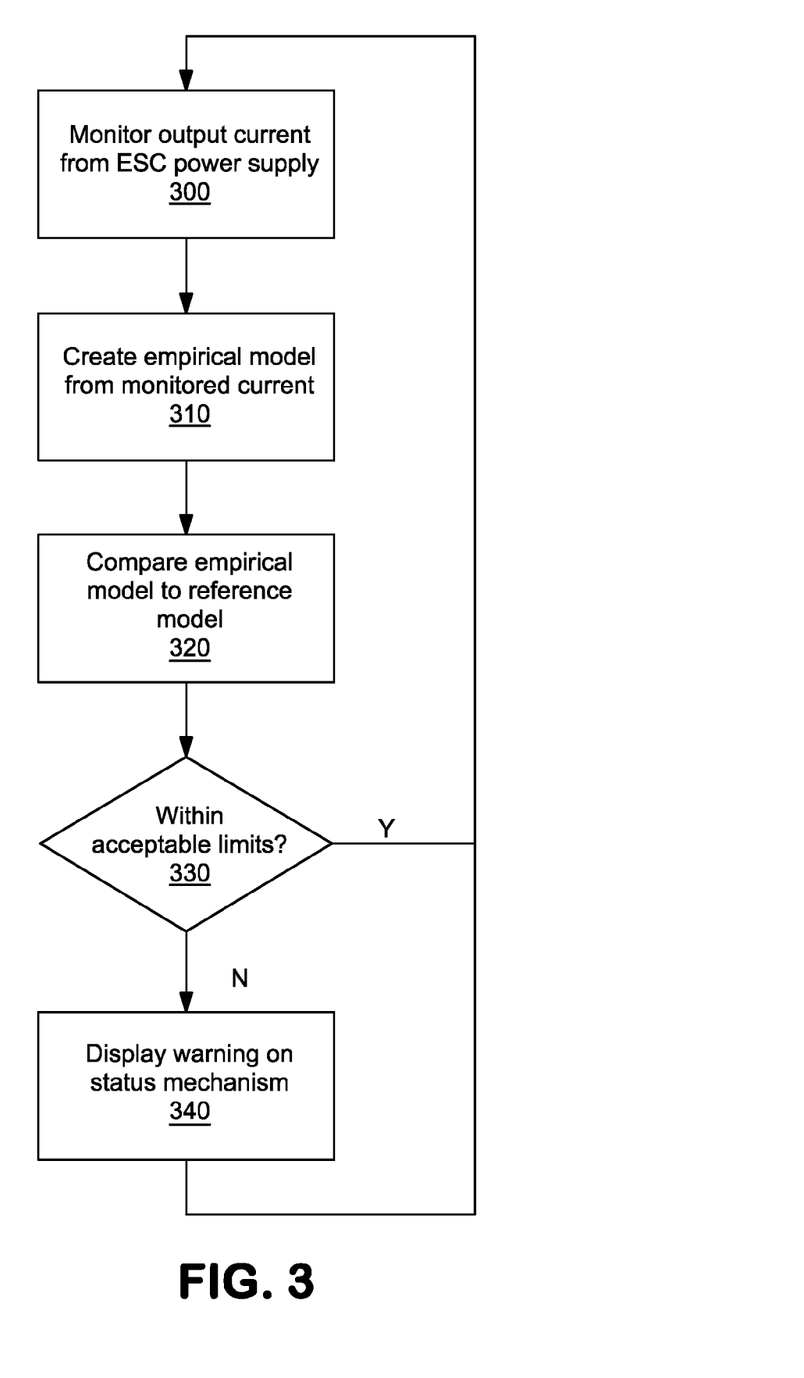
FIG. 3 illustrates a representative flowchart used to detect an impending failure.
Figure 5:
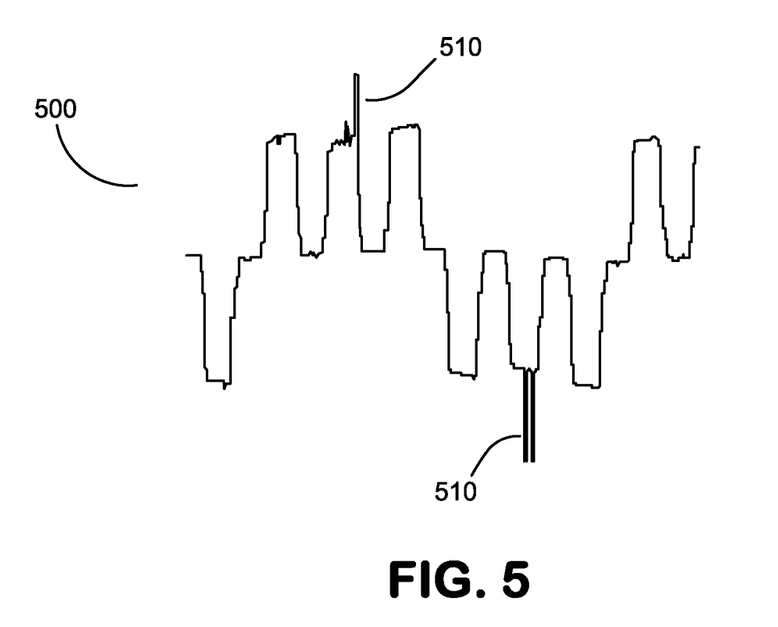
FIG. 5 illustrates an example output waveform provided to the ESC from the ESC power supply.
Figure 6:
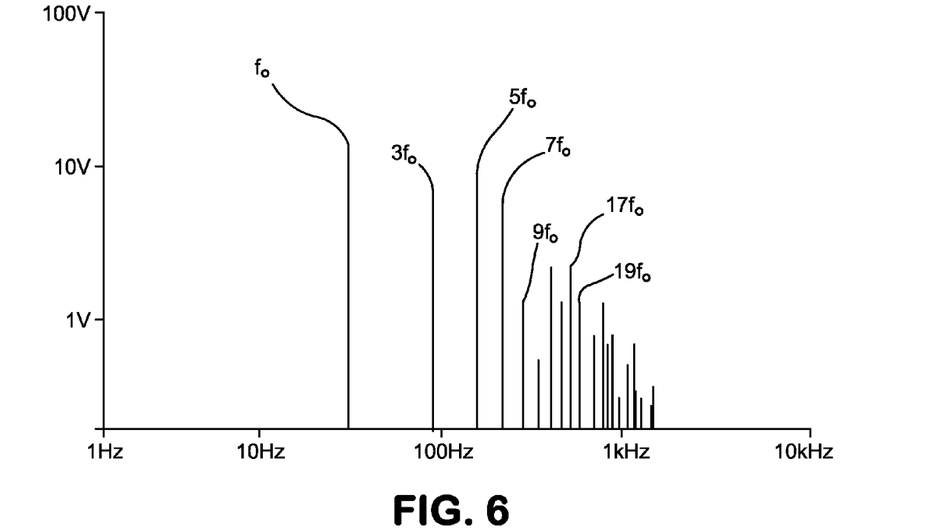
FIG. 6 illustrates an empirical model generated based on the output waveform of FIG. 5.
Figure 7:
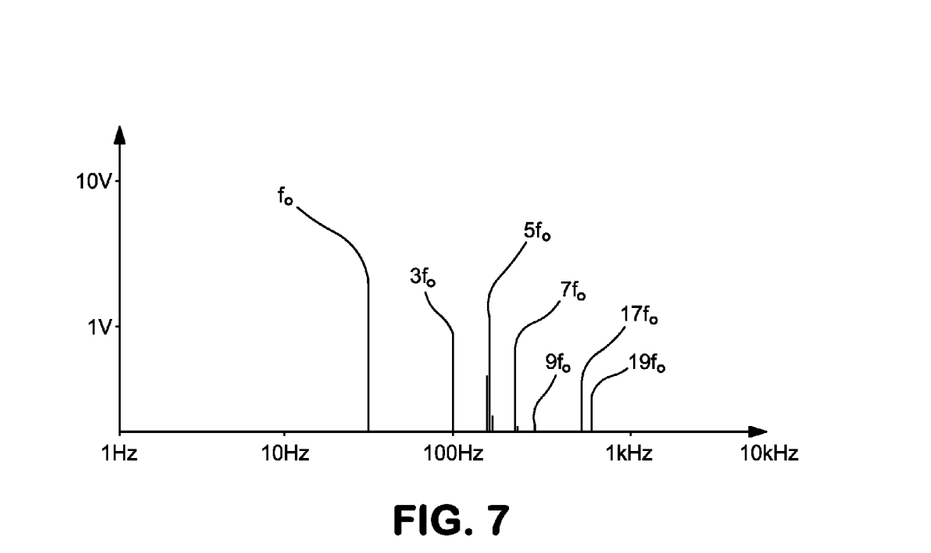
FIG. 7 illustrates a reference model of a known good ESC in the frequency domain.
Figure 8:
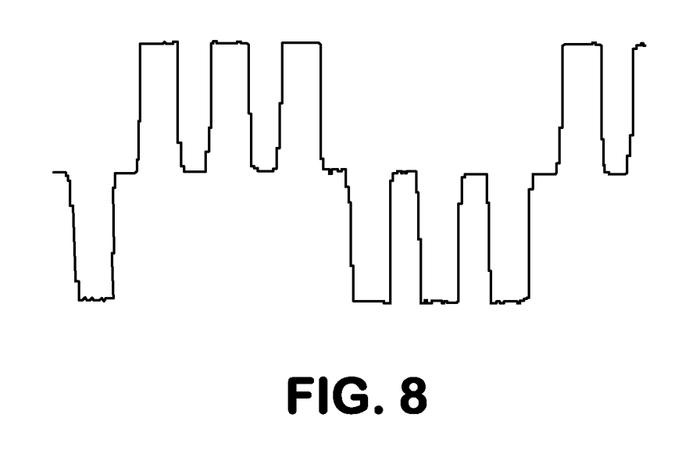
FIG. 8 illustrates a reference model of a known good ESC in the time domain.

FIG. 3 shows a flowchart illustrating the steps described herein. First, as described above, the output current from the ESC power supply 230 is monitored, in step 300. FIG. 5 shows an example waveform 500 that may be provided to the ESC 200 from the ESC power supply 230. In this particular waveform, several high frequency glitches 510 may be seen, which are not present in the nominal or expected waveform, which is shown in FIG. 8. This waveform is then converted to a series of digital values using an ADC. These converted digital values are then used to create the empirical model, as shown in step 310. This step is performed using a processing unit executing instructions to manipulate the converted digital values. In one embodiment, these digital values are used by the processing unit to create a frequency spectrum of the output current. This frequency spectrum is then stored in some format in a storage element. For example, FIG. 6 shows a graphical representation of a frequency domain empirical model, created using the output waveform of FIG. 5. Since the fundamental frequency ($f_o$) of the example waveform 500 is 30 Hz, the frequency domain shows components at odd multiples of this frequency, such as 90 Hz ($3*f_o$), 150 Hz ($5*f_o$), 210 Hz ($7*f_o$), etc. In addition, other frequencies are present or are of unexpected amplitude. These discrepancies are a consequence of the glitches 510 which appear in the time domain waveform of FIG. 5. In other words, the glitches 510 of FIG. 5 are manifested as additional or modified frequency components in the empirical model of FIG. 6. In another embodiment, the digital values are used to create a time domain model, which is stored in a storage element. This empirical model is then compared to a reference model, which was previously saved, as shown in step 320. This reference model represents the expected waveform. As described above, the expected frequency composition of a bipolar waveform includes odd harmonics of the fundamental frequency, such as is shown in FIG. 7. If the empirical model deviates from acceptable limits, a warning is displayed to the operator using the status mechanism 247, as shown in step 440. This cycle then repeats as required. For example, comparing the graph of FIG. 6 to that of FIG. 7, it can be seen that there are multiple frequency discrepancies, which may be indicative of an impending failure. For example, several odd harmonics have excessive amplitudes. In addition, many frequencies which are not odd harmonics have a significant amplitude.

While FIGS. 6-7 show frequency domain representations of the empirical model and the reference model, respectively, time based representations of the empirical model and the reference model may also be employed. For example, a digitized representation of FIG. 5 may be created as a time domain empirical model. This can be compared against a digitized representation of FIG. 8, which is a time domain reference model. The data used to store these graphs can be organized in any suitable format. For example, a table can be used to store this information, where each entry comprises two items, where the first may represent time and the second may represent average or maximum amplitude. In other embodiments, each entry may multiple items, such as time, minimum amplitude, maximum amplitude and/or average amplitude. These digitized representations can then be compared to determine whether an impending failure is likely to occur absent corrective action. Again, in this scenario, the time domain empirical model would indicate the presence of glitches that are not present in the time domain reference model. For example, the amplitude at a particular point in the period may be much greater in the time domain empirical model than the amplitude of that point in the time domain reference model.

The steps shown in FIG. 3 can be executed by one or more processing units. For example, the steps 300-310 may be performed by the ESC processing unit, while the remaining steps may be performed using the system controller processing unit. In other embodiments, all of the steps are performed by a single processing unit.

The above description illustrates a system and method to detect an impending failure of an ESC 200, or a faulty connection between the ESC 200 and the ESC power supply 230. However, in further embodiments, the empirical model may be further analyzed to determine the actual failure mode. A variety of failure modes are known to exist.

For example, as described above, an ESC 200 may be in communication with an ESC power supply 230 through the use of pogo pins and conductive contacts. One particular failure mode occurs when one or more pogo pins does not extend completely to meet the conductive contact.

In some embodiments, the ESC may have deionized (DI) water flowing through it to maintain a desired temperature. Corrosion to the DI water port may cause water to leak and reach the ESC electrical contacts. The water may cause shorting between adjacent contacts on the ESC, thereby creating a second failure mode.

In some embodiments, KAPTON tape may be used as an insulator. Failure of this insulator may create another failure mode. Other common failure modes may also exist.

Figure 9:
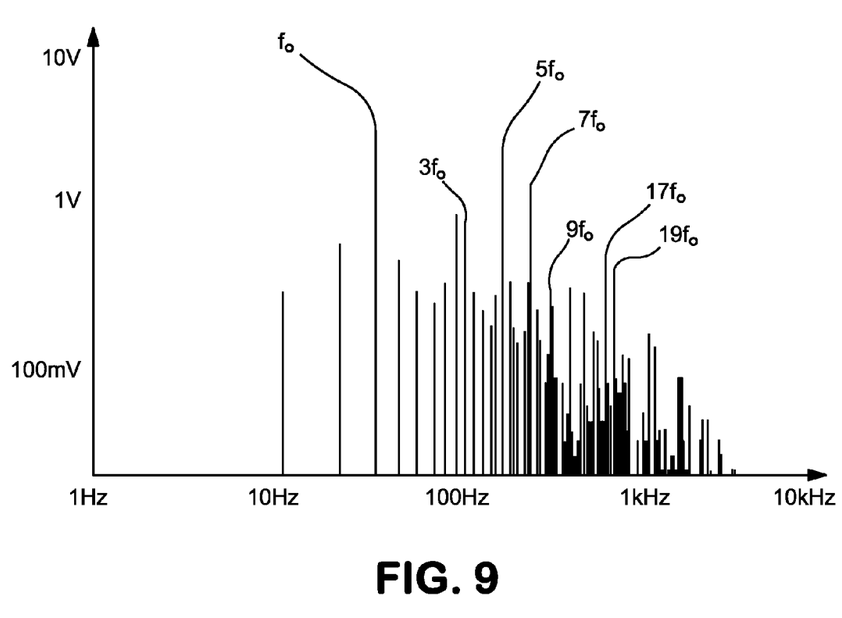
FIG. 9 illustrates one representative failure reference model.

In some embodiments, the empirical model of the output voltage may allow the processing unit to distinguish between these different failure modes. For example, a failure reference model corresponding to one or more failure modes may be compared against the empirical model. Thus, in this embodiment, the processing unit may display on the status mechanism, not only that a failure has occurred, but also what the failure is. For example, the waveform of FIG. 9 represents the frequency spectrum that is generated when one or more pogo pins do not fully extend. This frequency spectrum differs significantly from the reference model, in which many additional frequencies are present at varying amplitudes. This waveform may be used as a failure reference model for this particular type of failure. Since this frequency spectrum differs from that of the empirical model shown in FIG. 6, it may be determined that the failure mode seen in FIG. 6 is not caused by defective pogo pins. Similar comparisons may be done with other failure reference models. The use of failure reference models allows the operator to quickly pinpoint the problem, address it, and return the ion implanting system 205 to operational status.

Figure 4:
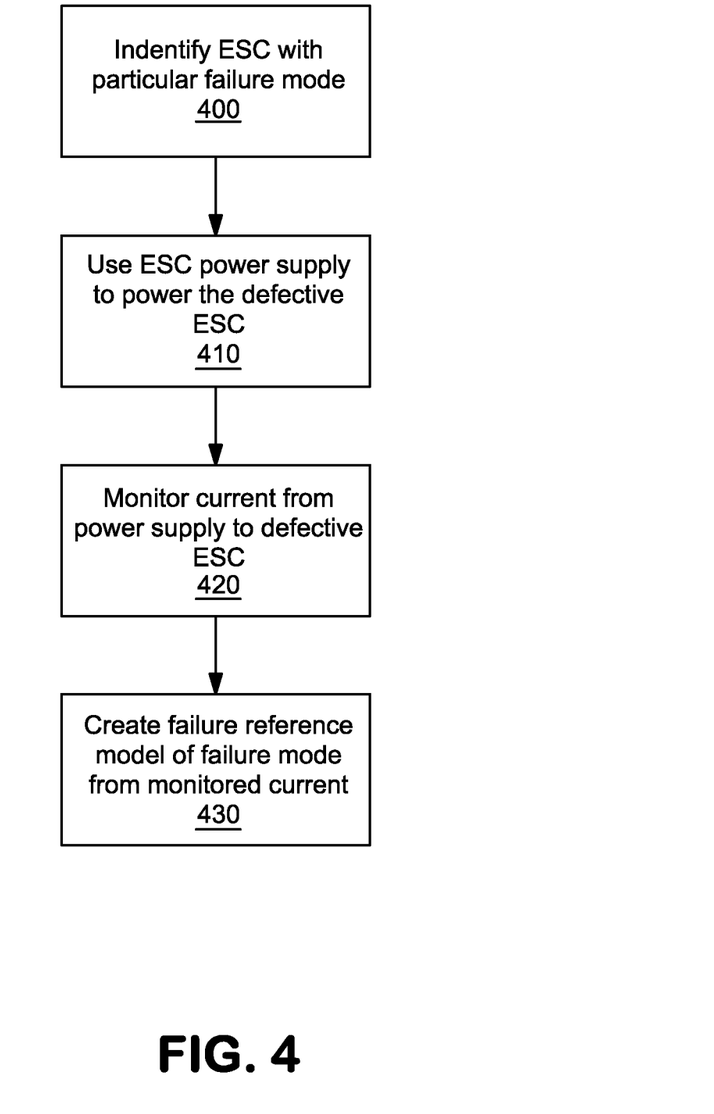
FIG. 4 illustrates a representative flowchart used to generate a failure reference model for a particular failure mode.

For example, FIG. 4 shows a flowchart of this process. First, as shown in step 400, an ESC having the particular failure mode is identified. The ESC with the particular known failure mode, such as one of those described above, may be installed on the system of FIG. 2, as shown in step 410. The ESC power supply is then used to power the ESC, as it would a fully operational ESC, as shown in step 420. The waveform from the ESC power supply 230 that is used to control the ESC is then monitored and analyzed so as to create a profile of a particular failure mode, as shown in step 430. This may be saved in the memory of the system controller 240 as a failure reference model for a particular failure mode. As described above, the failure reference model for the failure mode may be a time domain representation of the output waveform, or may be a frequency spectrum representation, as shown in FIG. 9. In some embodiments, failure reference models for multiple common failure modes are created in this way. In other embodiments, failure reference models for common failure modes are generated theoretically or by some other means.

For example, after determining that the empirical model shows an impending failure, the system may then compare the empirical model to a series of failure reference models for known failure modes. For example, a particular failure mode, such as leaking water or non-extending pogo pins, may have a characteristic profile, which may be captured as shown in FIG. 4. For example, the leaking water may always result in a frequency spectrum where certain frequencies are affected. Once it has been determined that the empirical model shows a failure, the empirical model can then be compared to the one or more known failure reference models of common failure modes. If a match is found, that information can be displayed to the operator, as explained above. This information may be used by the operator to not only shut down the system before a catastrophic failure, but also to help identify the cause of the impending failure, thereby reducing the time required to diagnose and fix the problem.

In addition, in some embodiments, the output current of the ESC power supply 230 may change somewhat, based on the geometry and configuration of the ESC 200 that it is connected to. Thus, by comparing the empirical model to various reference models, it may be possible to determine the particular configuration or model of the ESC that is being used in the ion implantation system 205. Based on this, it may also be possible to determine when unauthorized ESCs have been installed in the ion implantation system 205. For example, authorized ESCs may have an identifiable frequency domain signature. Installation of an ESC having a different frequency domain signature may be indicative of the use of a non-authorized ESC.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of monitoring a condition of an electrostatic chuck (ESC) comprising:
    monitoring an output waveform provided to said ESC from a power supply;
    converting said output waveform to a series of digital values;
    creating an empirical model from said digital values;
    comparing said empirical model to a reference model;
    determining, based on said comparison, that an impending potential failure is likely to occur absent corrective action; and
    outputting a result of said determining operation on a status mechanism.

2. The method of claim 1, wherein said output waveform comprises an AC current signal.

3. The method of claim 1, wherein said empirical model comprises a frequency spectrum representation of said output waveform.

4. The method of claim 1, wherein said empirical model comprises a time domain representation of said output waveform.

5. The method of claim 1, further comprising:
 comparing said empirical model to a failure reference model of a known failure mode if it is determined that an impending failure is likely to occur, so as to identify a cause of said impending failure; and
 displaying said cause on said status mechanism.

6. The method of claim 5, wherein said failure reference model of a known failure mode is generated by monitoring an output waveform of said ESC power supply while said ESC power supply is in electrical communication with an ESC having said known failure mode.

7. The method of claim 1, wherein said ESC supports a workpiece in an ion implantation system.

8. The method of claim 1, wherein said output waveform comprises a bipolar square wave AC signal having a fundamental frequency and said converting step is performed at a sampling rate of at least ten times said fundamental frequency.

9. A non-transitory computer readable medium, comprising instructions, which when executed by a processing unit:
 monitor an output waveform provided to an electrostatic chuck (ESC) from a power supply;
 convert said monitored output waveform to a series of digital values;
 create an empirical model from said digital values;
 compare said empirical model to a reference model;
 determine, based on said comparison, that an impending potential failure is likely to occur absent corrective action; and
 display a result of said determining operation on a status mechanism.

10. The non-transitory computer readable medium of claim 9, further comprising creating a frequency spectrum representation of said monitored output waveform.

11. The non-transitory computer readable medium of claim 9, wherein said instructions:
 compare said empirical model to a failure reference model of a known failure mode if it is determined that an impending failure is likely to occur, so as to identify cause of said impending failure; and
 display said cause on said status mechanism.

12. The non-transitory computer readable medium of claim 11, wherein said instructions generate said failure reference model of a known failure mode by monitoring an output of said power supply while said power supply is in electrical communication with an ESC having said known failure mode.

13. The non-transitory computer readable medium of claim 9, wherein said output waveform comprises a bipolar square wave having a fundamental frequency and said converting step is performed at a rate of at least ten times said fundamental frequency.

14. A system of identifying impending failures in an ion implantation system, comprising:
 an electrostatic chuck (ESC);
 an ESC power supply in communication with said ESC, said ESC power supply comprising:
  an analog to digital converter;
  an ESC processing unit; and
  a storage element in communication with said ESC processing unit, comprising instructions, which when executed by the ESC processing unit, cause the ESC power supply to:
   monitor an output current provided to said ESC by said ESC power supply;
   convert said monitored output current to a series of digital values; and
   create an empirical model based on said digital values; and
 a system controller, in communication with said ESC power supply, comprising:
  a status mechanism;
  a processing unit; and
  a storage element in communication with said processing unit, comprising instructions, which when executed by the processing unit, cause the system controller to:
   receive said empirical model from said ESC power supply;
   compare said empirical model to a reference model; and
   provide an indication on said status mechanism if results of said comparison indicate an impending failure is likely to occur absent corrective action.

15. The system of claim 14, wherein said empirical model comprises a frequency spectrum representation of said monitored output current.

16. The system of claim 14, wherein said instructions in said storage element in said system controller cause said system controller to:
 compare said empirical model to a failure reference model of a known failure mode if it is determined that an impending failure is likely to occur, so as to identify cause of said impending failure; and
 display said cause on said status mechanism.

17. The system of claim 14, wherein said failure reference model of a known failure mode is generated by monitoring an output of said power supply while said power supply is in electrical communication with an ESC having said known failure mode.

18. The system of claim 14, wherein said output current comprises a bipolar square wave having a fundamental frequency and said converting step is performed at a rate of at least ten times said fundamental frequency.

* * * * *